United States Patent
Feng et al.

(10) Patent No.: US 7,308,387 B1
(45) Date of Patent: Dec. 11, 2007

(54) METHOD AND SYSTEM FOR NUMERICALLY SIMULATING FOAM-LIKE MATERIAL IN FINITE ELEMENT ANALYSIS

(75) Inventors: William W. Feng, Lafayette, CA (US); Paul A. DuBois, Offenbach (DE); John O. Hallquist, Livermore, CA (US)

(73) Assignee: Livermore Software Technology Corp., Livermore, CA (US)

( * ) Notice: Subject to any disclaimer, the term of this patent is extended or adjusted under 35 U.S.C. 154(b) by 491 days.

(21) Appl. No.: 10/783,562

(22) Filed: Feb. 19, 2004

Related U.S. Application Data

(63) Continuation-in-part of application No. 10/669,047, filed on Sep. 23, 2003.

(51) Int. Cl.
*G06F 17/50* (2006.01)
*G06G 7/48* (2006.01)

(52) U.S. Cl. ............................................. 703/1; 703/7
(58) Field of Classification Search .................... 703/1, 703/7
See application file for complete search history.

(56) References Cited

OTHER PUBLICATIONS

Nonlinear FEA of Elastomers-MSC Technical Paper, MSC Software, Technical Paper 2000, p. 1-61.*
Gallagher et al., "An Efficient 3-D Visualization Technique for Finite Element Models and Other Coarse Volumes" 1989 ACM p. 185-194.*
Peric et al., "Finite-Element Applications to the Non-linear Mechanics of Solids" 1998 Univ of Wales p. 1495-1574.*

\* cited by examiner

*Primary Examiner*—Paul Rodriguez
*Assistant Examiner*—Juan Carlos Ochoa
(74) *Attorney, Agent, or Firm*—Roger Chu

(57) ABSTRACT

A method and system to numerically simulating structural responses of a highly compressible material such as foam in finite element analysis is disclosed. According to one aspect of the simulation, a new improved method for calculating structural responses is derived using the following assumptions: uniaxial loading and isotropic material. As a result of the new method, Ogden polynomial stress function $f(\lambda)$ is replaced by a tabulated function depending upon only a set of stress-strain curves obtained via uniaxial tension and compression tests. The method is implemented in a finite element analysis software product.

20 Claims, 7 Drawing Sheets

$$W = \sum_{i=1}^{3}\sum_{j=1}^{m}\frac{\mu_j}{\alpha_j}\left[\left(\lambda_i^{\alpha_j}-1\right)+\frac{1}{n}\left(J^{-n\alpha_j}-1\right)\right]$$

$$J = \lambda_1\lambda_2\lambda_3;$$

110

$$J\sigma_i = \sum_{j=1}^{m}\mu_j\left[\lambda_i^{\alpha_j}-J^{-n\alpha_j}\right], i=1,2,3$$

120

$$\sigma_{oi} = \frac{1}{\lambda_i}\sum_{j=1}^{m}\mu_j\left[\lambda_i^{\alpha_j}-J^{-n\alpha_j}\right], i=1,2,3$$

130

$$\lambda_2 = \lambda_3; \lambda_3 = \lambda_1^{-n/(2n+1)}$$

$$n = \frac{-\ln\lambda_3}{2\ln\lambda_3+\ln\lambda_1}$$

140

$$\sigma_0(\lambda_1) = \frac{1}{\lambda_1}\sum_{j=1}^{m}\mu_j\left[\lambda_1^{\alpha_j}-\lambda_1^{\frac{-n\alpha_j}{2n+1}}\right]$$

$$f(\lambda_i) = \sum_{j=1}^{m} \mu_j \lambda_i^{\alpha_j}$$
— 210

$$\lambda_1 \sigma_0(\lambda_1) = f(\lambda_1) - f\left(\lambda_1^{-n/(2n+1)}\right)$$
— 220

$$\upsilon = n/(2n+1)$$
— 230

$$\lambda \sigma_0(\lambda) = f(\lambda) - f(\lambda^{-\upsilon})$$
— 240

$$\lambda^{-\upsilon} \sigma_0(\lambda^{-\upsilon}) = f(\lambda^{-\upsilon}) - f(\lambda^{\upsilon^2})$$
— 250

$$\lambda^{\upsilon^2} \sigma_0(\lambda^{\upsilon^2}) = f(\lambda^{\upsilon^2}) - f(\lambda^{-\upsilon^3})$$

$$f(\lambda) = \lambda\sigma_0(\lambda) + \lambda^{-\upsilon}\sigma_0(\lambda^{-\upsilon})$$
$$+ \lambda^{\upsilon^2}\sigma_0(\lambda^{\upsilon^2})$$
$$+ \lambda^{-\upsilon^3}\sigma_0(\lambda^{-\upsilon^3}) + ...$$

310

$$f(\lambda) = \lambda\sigma_0(\lambda) + \sum_{j=1}^{m} \lambda^{[-\upsilon]^j}\sigma_0(\lambda^{[-\upsilon]^j})$$

320

$$\varepsilon_i = \lambda_i - 1$$

330

$$f(\lambda_i) = \lambda_i\sigma_0(\varepsilon_i) + \sum_{j=1}^{m} \lambda_i^{[-\upsilon]^j}\sigma_0(\lambda_i^{[-\upsilon]^j} - 1)$$

340

$$\sigma_{0i} = \frac{1}{\lambda_i}\left[f(\lambda_i) - f(J^{-n})\right]; i = 1,2,3$$

350

$$\sigma_i = \frac{1}{J}\left[f(\lambda_i) - f(J^{-n})\right]; i = 1,2,3$$

METHOD AND SYSTEM FOR NUMERICALLY SIMULATING FOAM-LIKE MATERIAL IN FINITE ELEMENT ANALYSIS

CROSS REFERENCE TO RELATED APPLICATION

This application is a continuation-in-part of a U.S. patent application Ser. No. 10/669,047 filed Sep. 23, 2003, the entire contents of which are incorporated herein by reference.

BACKGROUND OF THE INVENTION

1. Field of the Invention

The present invention generally relates to method, system and software product used in finite element analysis, more particularly to numerical simulation of the structural behaviors of highly compressible material such as foam under loading conditions.

2. Description of the Related Art

Finite element analysis (FEA) is a computerized method widely used in industry to model and solve engineering problems relating to complex systems. FEA derives its name from the manner in which the geometry of the object under consideration is specified. With the advent of the modern digital computer, FEA has been implemented as FEA software. Basically, the FEA software is provided with a model of the geometric description and the associated material properties at each point within the model. In this model, the geometry of the system under analysis is represented by solids, shells and beams of various sizes, which are called elements. The vertices of the elements are referred to as nodes. The model is comprised of a finite number of elements, which are assigned a material name to associate with material properties. The model thus represents the physical space occupied by the object under analysis along with its immediate surroundings. The FEA software then refers to a table in which the properties (e.g., stress-strain constitutive equation, Young's modulus, Poisson's ratio, thermo-conductivity) of each material type are tabulated. Additionally, the conditions at the boundary of the object (i.e., loadings, physical constraints, etc.) are specified. In this fashion a model of the object and its environment is created.

FEA is becoming increasingly popular with automobile manufacturers for optimizing both the aerodynamic performance and structural integrity of vehicles. Similarly, aircraft manufacturers rely upon FEA to predict airplane performance long before the first prototype is built. Rational design of semiconductor electronic devices is possible with Finite Element Analysis of the electrodynamics, diffusion, and thermodynamics involved in this situation. FEA is utilized to characterize ocean currents and distribution of contaminants. FEA is being applied increasingly to analysis of the production and performance of such consumer goods as ovens, blenders, lighting facilities and many plastic products. In fact, FEA has been employed in as many diverse fields as can be brought to mind, including plastics mold design, modeling of nuclear reactors, analysis of the spot welding process, microwave antenna design, simulating of car crash and biomedical applications such as the design of prosthetic limbs. In short, FEA is utilized to expedite design, maximize productivity and efficiency, and optimize product performance in virtually every stratum of light and heavy industry. This often occurs long before the first prototype is ever developed.

The finite element analysis method is described in detail by Thomas J. R. Hughes in "The Finite Element Method" (1987), published by Prentice-Hall, Inc., New Jersey, which is incorporated herein by reference in its entirety. Generally, FEA begins by generating a finite element model of a system. In this model, a subject structure is reduced into a number of node points which are connected together to form finite elements. Governing equations of motion are written in a discrete form, where the motions of each node point are the unknown part of the solution. A simulated load or other influence is applied to the system and the resulting effect is analyzed using well known mathematical methods.

FEA software can be classified into two general types, implicit FEA software and explicit FEA software. Implicit FEA software uses an implicit equation solver to solve a system of coupled linear equations. Such software is generally used to simulate static or quasi-static problems. Explicit FEA software does not solve coupled equations but explicitly solves for each unknown assuming them uncoupled. Explicit FEA software usually uses central difference time integration which requires very small solution cycles or time steps for the method to be stable and accurate. Explicit FEA software is generally used to simulate short duration events where dynamics are important such as impact type events.

One of the most challenging FEA tasks is to simulate an impact event such as car crash. The highly non-linear behavior of the structural materials must be numerically simulated accurately, realistically and efficiently. A number of materials such as steel, aluminum, foam and rubber that used in an automobile must be included in such FEA software. Many components used in an automobile are made of materials such as foam and rubber, the simulation of the structural responses of these materials becomes very important for the overall accuracy of an analysis.

Traditionally the structural responses of highly compressible material such as foam have been numerically simulated using the Ogden strain energy function W. A brief summary of the Ogden strain energy function and corresponding engineering/nominal stress $\sigma_0$ and Cauthy/true stress $\sigma$ functions are listed in FIG. 1. More details of the Ogden energy function is described by R. W. Ogden in Chapter 7 of the book titled: "Non-linear Elastic Deformations" (1984), published by Ellis Horwood Limited, United Kingdom, which is incorporated herein by reference in its entirety. A number of commercially available FEA software includes these approaches to simulate foam-like material. For example, LS-DYNA, a general purpose three-dimensional non-linear large-deformation FEA software from Livermore Software Technology Corporation, is capable of simulating foam-like material using the Ogden energy function.

Today, there are a number of practical problems associated with the simulation of foam-like material in FEA. To implement the Ogden energy function properly in the FEA software requires engineers to spend a tremendous amount of time to prepare experimental data and then convert them into a set of coefficients to fit a polynomial Ogden function for FEA software. Due to highly non-linear characteristics of this polynomial function, the inexactly fitted function has often resulted. This leads to a lengthy iterative trial-and-error process of modifying the input coefficients to match the behavior of foam-like material in the real world. It is therefore desirable to have a new method to numerically simulate foam-like material more efficiently and effectively.

SUMMARY OF THE INVENTION

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

The present invention discloses a system, method and software product to numerically simulate highly compressible material such as foam with a pragmatic approach. Under the assumption of uniaxial loading and isotropic material, a method of calculating stress function $f(\lambda)$ is developed as shown in FIGS. 2 and 3. The method eliminates the requirement of fitting a polynomial function; instead $f(\lambda)$ is calculated using only a set of the stress-strain curve from a uniaxial loading test. Based upon the data of this stress-strain curve, the stress function $f(\lambda)$ is precomputed for a range of equally spaced stretch ratios $\lambda$. These results are stored in a computer's RAM as a lookup table and retrieved later during the solution phase of FEA. The present invention does not require time-consuming trial-and-error process of fitting polynomial coefficients. This is a huge advantage over the existing method. The stresses corresponding to a particular strain or stretch ratio can be interpolated rapidly from the pre-computed table directly during the lengthy solution phase.

According to one aspect of the present invention, during the solution phase of FEA, the stresses at each integration point of the finite elements is computed for each time step. In order to compute the stresses, the eigensolution of a 3×3 stretch tensor is computed first. The resulting eigenvalues are the three main stretch ratios for the element. The corresponding engineering/nominal stress is then looked up or interpolated. These nominal stresses are converted into the true stresses and transformed to the global coordinate system. If the rate dependent viscoelastic effect is needed, the nominal stresses are looked up from a set of curves instead of a single curve.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

FIG. 1 lists the Ogden strain energy function and associated formula for nominal and true stresses for compressible material such as foam.

FIGS. 2 and 3 show the detailed derivation of the stress function $f(\lambda)$ for the present invention based on compressible material and uniaxial loading. The stress function $f(\lambda)$ is only dependent upon stress-strain curve obtain via a uniaxial loading test.

DETAILED DESCRIPTION OF THE PREFERRED EMBODIMENTS

Figure 4:
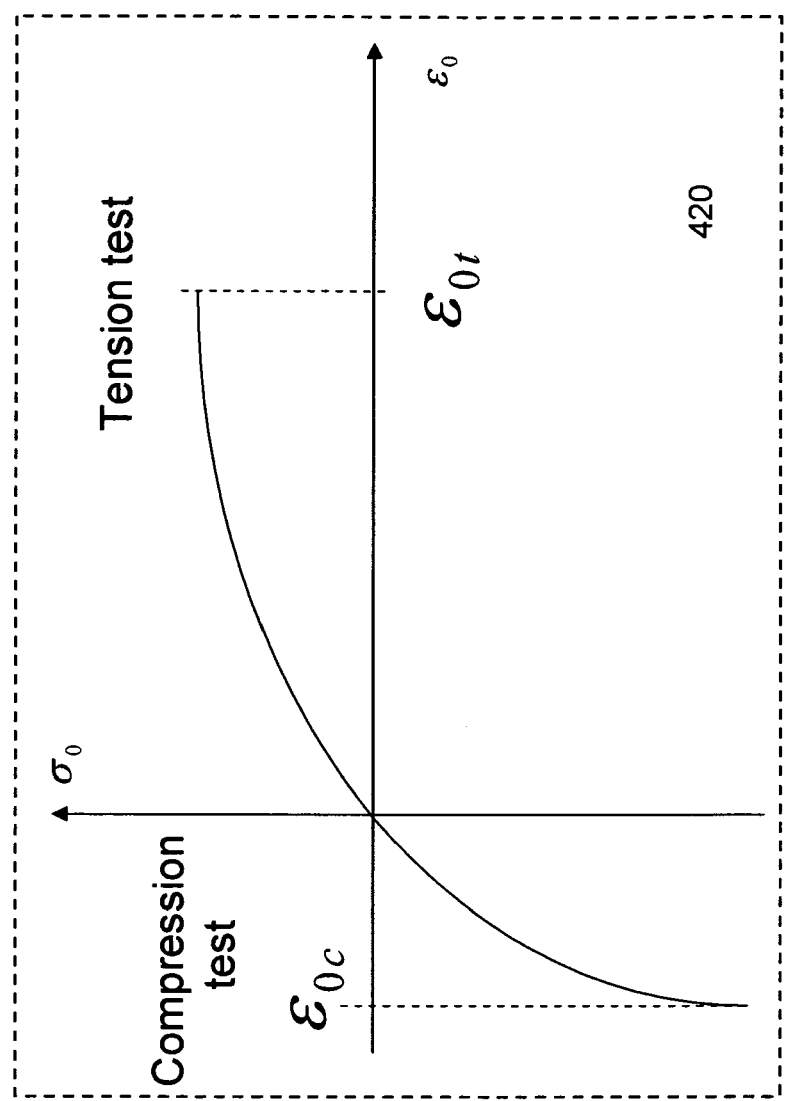
FIG. 4 shows an exemplary engineering stress-strain curve obtained from a uniaxial loading test.

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

To facilitate the description of the present invention, it deems necessary to provide definitions for some terms that will be used throughout the disclosure herein. It should be noted that the definitions following are to facilitate the understanding and describe the present invention according to an embodiment. The definitions may appear to include some limitations with respect to the embodiment, the actual meaning of the terms has applicability well beyond such embodiment, which can be appreciated by those skilled in the art:

FEA stands for Finite Element Analysis.

Implicit FEA refers to Kx'F, where K is the global stiffness matrix, x is the unknown displacement array and F is the global force array.

Explicit FEA refers to Ma=F, where M is the mass array, a is the acceleration array and F is the global force array.

Time domain analysis refers to a FEA that simulates a physical phenomenon in time domain.

Dynamic analysis refers to a FEA that accounts for the mass and inertia effects of a structure. In general, there are two classes of dynamic analysis: time domain and frequency domain.

Solution cycle and cycle are used interchangeably to refer to the numbered solution states starting with cycle 0 at time 0.

The time step refers to an interval of time between subsequent cycles.

Loading Condition is defined as the external load acting on a structure.

Uniaxial Load is either tension or compression in one direction.

Longitudinal Direction is the direction, in which the uniaxial force applies to a material.

Lateral Direction is the orthogonal direction to the longitudinal direction.

Tension is a force to pull or stretch a material.

Compression is a force to squeeze or press a material.

Stress is defined as the intensity of force or force per unit area of the material.

Stretch Ratio λ is defined as the ratio between the deformed length and the original length of a material.

Strain ε is a non-dimensional quantity representing the elongation or shrinkage per unit length of a material under loading condition. The Strain and Stretch Ratio is related with the following equation: ε=λ−1.

Strain Rate is defined as the amount of strain that develops in one unit of time.

Poisson's Ratio ν is defined as a function of the strain in lateral direction to the strain in the longitudinal direction. Strain Energy is potential energy generated from the force acting on a material. In the elastic case, the strain energy is defined as W=0.5*ε*σ.

Deformation Gradient Matrix/Tensor is defined as the local nature of the deformation of a solid body.

Principal Stretch Ratio is defined as the stretch ratio in the principal loading direction.

Eigensolution is a mathematical method to determine the natural vibration mode shapes and amplitudes of a structure.

Eigenvalues are the results obtained from the eigensolution.

Elastic material is a material that recovers to its original shape after unloading (i.e., the load is removed).

Hyperelastic material is a material has one-to-one relationship between stress and strain for a large deformation. The stress value can be determined by an energy function such as Stress function $f(\lambda)$.

Quasistatic loading is defined as the static force dominates comparing to inertia and damping forces.

Rate dependent under dynamic loading means that under dynamic loading the material is no longer quasistatic; for the same values of strain, different values of stress may be obtained depending upon the loading velocity or strain rate. Rate dependent under dynamic loading and viscous material are interchangeably used.

Nominal stress or Engineering stress, interchangeably used herein, is defined as the force divided by undeformed cross section area.

True stress or Cauchy stress, interchangeably used herein, is defined as the force divided by current or deformed cross section area.

Local coordinate system or element coordinate system, interchangeably used herein, is a coordinate system used to define element structural responses such as true stress and nominal stress.

Global coordinate system is a coordinate system used to define the structure in FEA.

Embodiments of the present invention are discussed herein with reference to FIGS. 1-7. However, those skilled in the art will readily appreciate that the detailed description given herein with respect to these figures is for explanatory purposes as the invention extends beyond these limited embodiments.

Referring now to the drawings, in which like numerals refer to like parts throughout several views. FIG. 1 shows the structural response functions in the original Ogden highly compressible material model and derivation of nominal stress formula as function of longitudinal stretch ratio $\lambda_1$ based on the assumption of uniaxial loading and isotropic material. Ogden strain energy function W for compressible material is listed in 110. In these functions, $\lambda_1$, $\lambda_2$ and $\lambda_3$ represent the stretch ratios in three principal directions of a compressible material. The variable J is the volumetric ratio or the deformed volume divided by the undeformed volume. The material coefficient n is related to Poisson's ratio of the material. Coefficients μ and α are the material constants. The classic strain energy function W in 110 is the foundation to numerically simulate highly compressible material using a digital computer. The formula for true stress σ is listed in 120 and nominal stress $\sigma_0$ is listed in 130. Under the uniaxial tension or compressible loading, the coefficient n is determined in the formulas listed in 140. Under the isotropic material assumption, the two lateral stretch ratios $\lambda_2$ and $\lambda_3$ are equal to each other. The relationship between stretch ratio $\lambda_1$ in the uniaxial loading direction and lateral stretch ratio $\lambda_3$ is also listed in 140. Substitute $\lambda_2$ and $\lambda_3$ with $\lambda_1$ in the nominal stress formula in 130, the nominal stress formula can be written as a function of the longitudinal stretch ratio $\lambda_1$ as shown in 150. It is evident that element stresses can easily be calculated, once the coefficients μ and α have been determined; however, the determination of these coefficients for the polynomial function is very difficult in practice.

FIGS. 2 and 3 in combination show the derivation of stress function $f(\lambda)$. The original stress function $f(\lambda)$ in polynomial form is defined in 210. Substitute $f(\lambda)$ into the nominal stress $\sigma_0$ formula in 150, the resulting formula is shown in 220. In 230, Poisson's ratio ν is defined as function of material constant n. After substituting ν in formula 220, the new formula is listed as formula 240. Formula 250 is a result of replacing λ with $\lambda^{-\nu}$ in formula 240. The next formula 260 is similarly obtained by substituting $\lambda^{(-\nu)^2}$ into λ in formula 240. The process repeats for the rest of higher order formulas using the same substitution method.

By rearranging formulas 240, 250, 260 and the rest of higher order formulas, the resulting equation for stress function $f(\lambda)$ is rewritten as listed in 310. The equation 310 is rewritten as a different form equation as shown in 320. Wherein the value of stress function $f(\lambda)$ for the stretch ratio of interest λ equals to the summation of a sequence of $\lambda^{(-\nu)^j} \sigma_0(\lambda^{1-\nu^j})$, where j is an integer related to the j-th term of the sequence, ν is Poisson's ratio of the compressible material, and $\sigma_0(\lambda^{[-\nu]^j})$ is the stress value at stretch ratio $\lambda^{(-\nu)^j}$. Using the relationship between strain ε and stretch ratio λ in 330, the equation 320 transforms to equation 340, which can be evaluated solely with the stress values corresponding to the strains from the strain-stress curve obtained via a uniaxial tension/compression test of the material of interest. Finally, the nominal stress $\sigma_0$ and true stresses σ are rewritten and dependent only on the stress function $f(\lambda)$ listed in formulas 350 and 360, respectively Referring now to FIG. 4, an engineering or nominal stress-strain curve 420 is illustrated. The curve represents a set of experimental data for a compressible material under uniaxial loading condition; both tension and compression tests results are included. According to one embodiment of the present invention, the engineer needs only to prepare the experimental data such as this exemplary curve 420 as input to simulate compressible material in FEA software. In order to capture the stretch ratio of interest, an exemplary input requires a range of strain values shown in 430. If the viscous effect of compressible material is under consideration, the exemplary curve 420 may be replaced by a family of stress-strain curves resulting from dynamic experiments.

Figure 5:
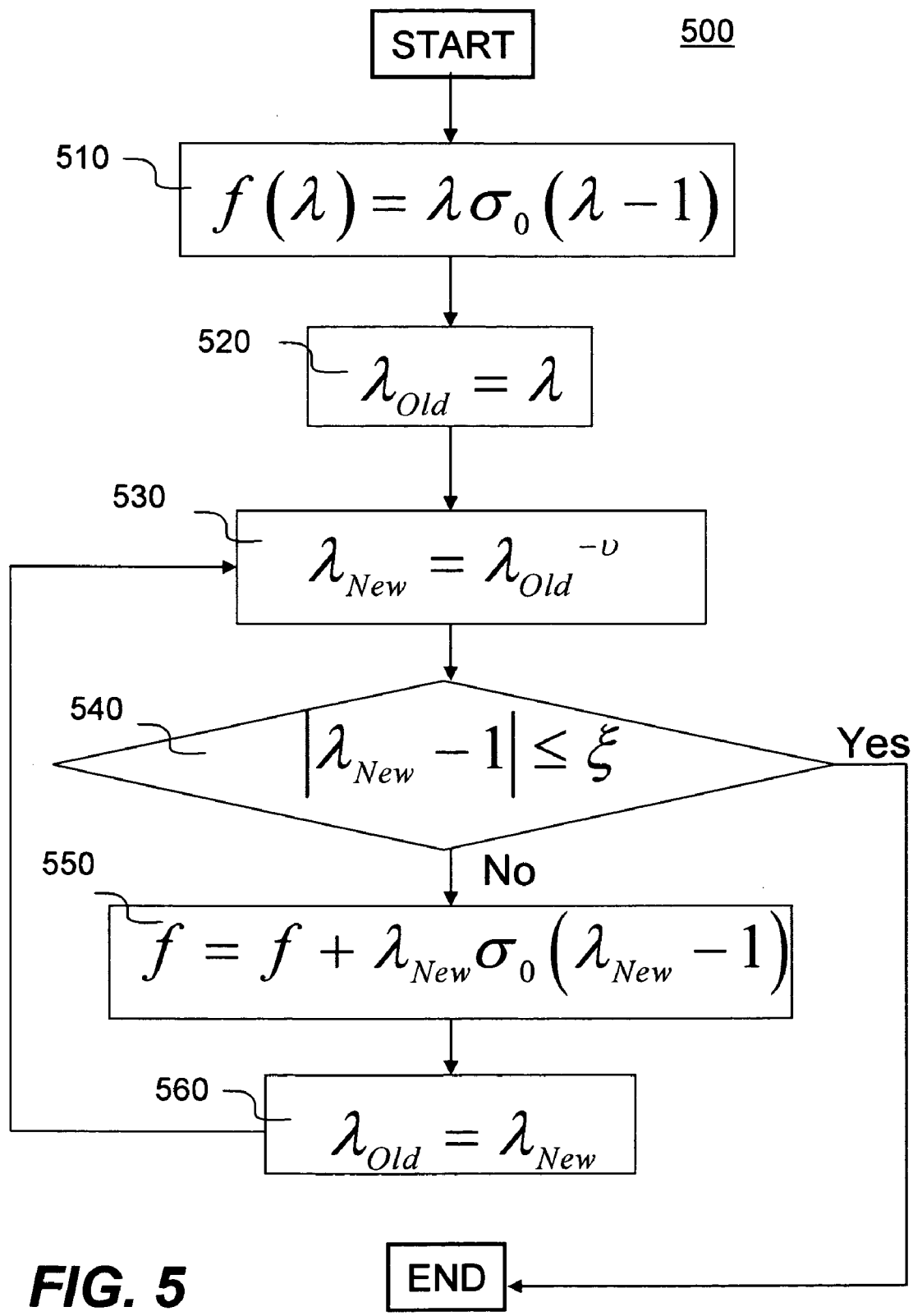
FIG. 5 shows a process to calculate the stress function $f(\lambda)$ based on the present invention.

With reference now to FIG. 5, it shows a flow chart 500 for computing the infinite series in equation 340. Because the order of magnitude decreases drastically from one term to the next, the sequence converges very rapidly. According to one embodiment of the present invention, the flow chart 500 of evaluation of function $f(\lambda)$ is summarized in FIG. 5. At 510, $f(\lambda)$ is assigned a value equals to λ multiplied by $\sigma_0(\lambda-1)$ for a given λ. The stress $\sigma_0$ value at strain $\epsilon_0$ or λ−1 is from engineering test strain-stress data (e.g., the curve defined in the user input phase of FEA software). At 520, λ is stored into a variable $\lambda_{old}$. A new variable $\lambda_{new}$ is stored as $\lambda_{old}^{-\nu}$ at 530, where $\nu$ is Poisson's ratio of the compressible material. At 540, a comparing test is performed for the absolute value of ($\lambda_{new}$−1) being less than or equal to a threshold value $\xi$. In one embodiment, $\xi$ is set to 0.01. If the test succeeds, the computation of f($\lambda$) has finished, the rest of the terms in the infinite series is too small to affect the final result of the computation. If the test fails, another stress value at strain $\lambda_{new}$−1 is multiplied by $\lambda_{new}$ and accumulated into function f($\lambda$) at 550. At 560, the value of $\lambda_{new}$ is stored into $\lambda_{old}$. The process goes back to 530 until the computation finishes.

Figure 6:
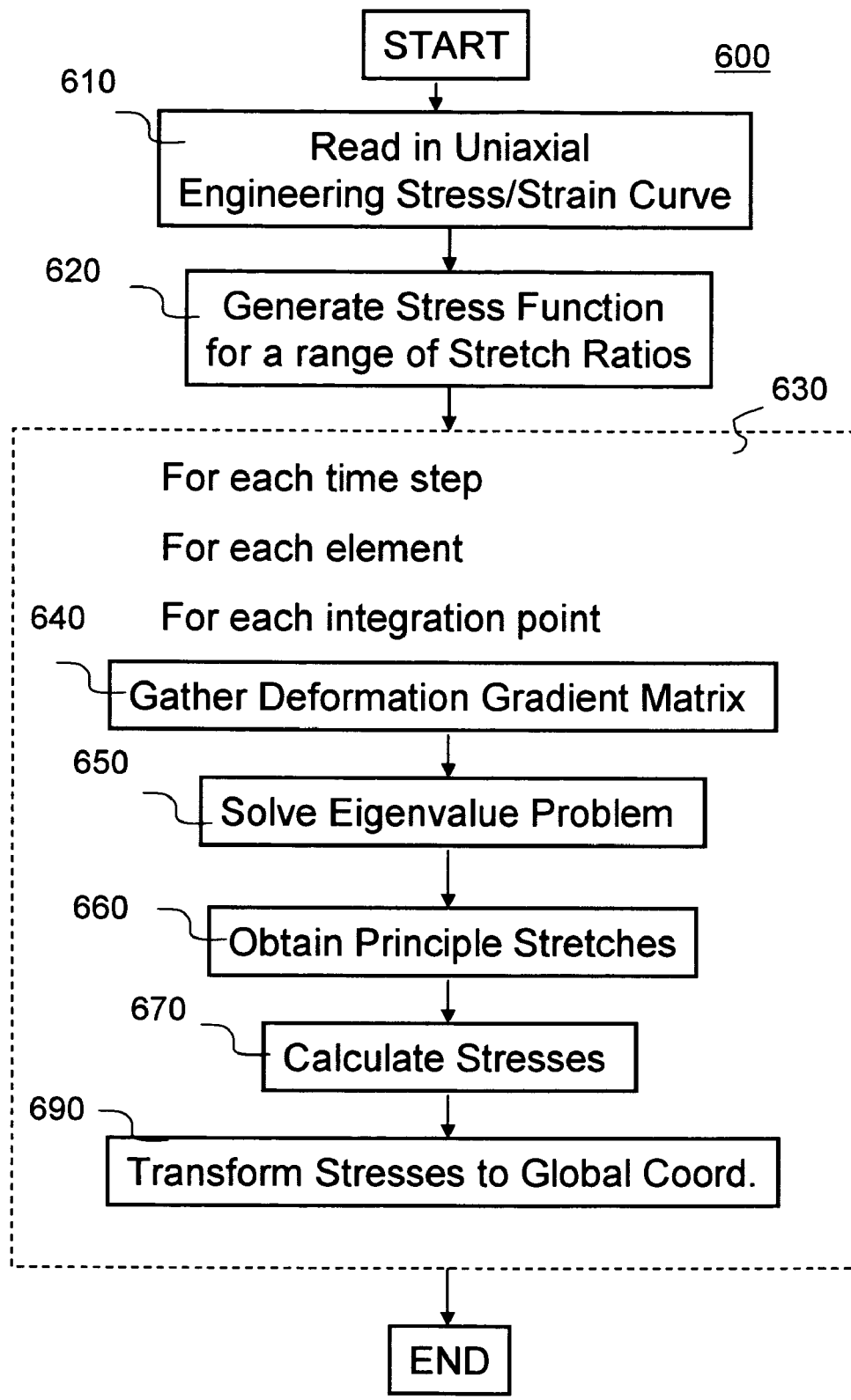
FIG. 6 is an exemplary flow chart of an implementation of the present invention in FEA software.

An exemplary FEA software implementation 600 of the present invention is shown in FIG. 6. At the input phase 610 of FEA software, at least one set of engineering or nominal stress-strain data for rubber material under uniaxial loading test is read in as a group of corresponding stress-strain pairs. If the loading condition is quasistatic, only one set of stress-strain curve is required. If the rate dependent dynamic loading condition is under consideration, then a family of stress-strain curves representing different strain rate are required. Based on the input stress-strain constitutive curve, a plurality of f($\lambda$) is then generated for a range of $\lambda$ at regular intervals at the initialization phase 620 using the process listed in flow chart 500 as shown in FIG. 5. These pre-computed f($\lambda$) are stored in computer's RAM as a stress function table for later use in the solution phase. Next in 630, the FEA software calculates structural responses at each integration point of every element for each time step. According to one embodiment, for the element with compressible material such as foam, a subroutine handling foam material is called. Within the subroutine, the deformation gradient matrix is gathered first at 640. For a solid element, either the left or the right 3×3 stretch tensors may represent the deformation gradient matrix. The deformation gradient matrix may be corresponded to the stretch ratio $\lambda$ or the stretch ratio squared $\lambda^2$ depending upon the solution scheme employed. At 650, an eigensolution is solved for the deformation gradient tensor. The principal stretch ratio can be calculated from the resulting eigenvalues at 660. With these stretch ratios, at 670, the nominal stresses are then calculated using the corresponding f($\lambda$) values stored in the initialization phase. Because all f($\lambda$) values of interest are pre-computed and stored as tabulated form, it is very computational efficient to perform a table lookup and interpolation. In the case of rate dependent dynamic loading, strain rate at the element integration point is used as basis to select two closest curves to determine the corresponding rate dependent stress. The true stresses are calculated and transformed into the global coordinate system at 690.

Figure 7:
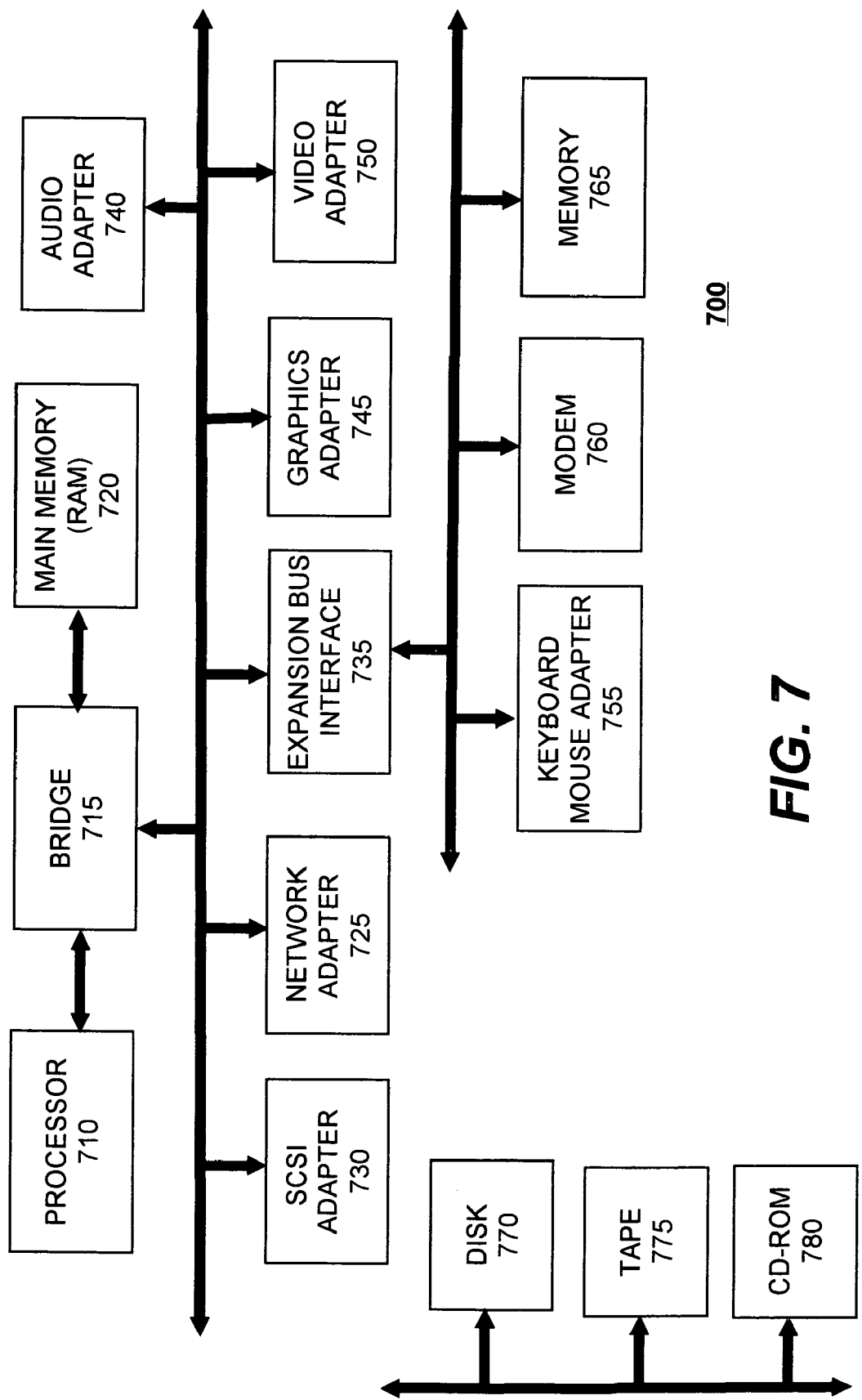
FIG. 7 depicts a block diagram of an exemplary computer, in which the present invention may be implemented.

With reference now to FIG. 7, a block diagram illustrates a computing device 700 in which the present invention may be implemented, and in which code or instructions implementing the processes of the present invention may be located. The exemplary computer system in FIG. 7 is discussed only for descriptive purposes. It should not be considered a limitation of the invention. Although the following descriptions related to a particular computer system, the concepts apply equally to other computer systems that are dissimilar to that shown in FIG. 7.

Computer system 700 includes a processor 710 and main random access memory (RAM) 720 connecting to a local bus 705 through a bridge 715. Additional connections to local bus 705 may be made through direct component interconnection or through add-in boards. In the depicted example, network adapter 725, small computer system interface (SCSI) adapter 730, and expansion bus interface 735 are directly connected to local bus 705. In contrast, audio adapter 740, graphics adapter 745, and video adapter 750 are connected to local bus 705 by add-in boards inserted into expansion slots. Expansion bus interface 735 provides a connection for a keyboard and mouse adapter 755, modem 760, and additional memory 765. SCSI adapter 730 provides a connection for hard disk drive 770, tape drive 775, and CD-ROM drive 780.

In order to communicate with other computer systems via a network, the computer system 700 connects to the network via network adapter 725. The network, Internet or intranet, connects multiple network devices utilizing general purpose communication lines.

Those of ordinary skill in the art will appreciate that the hardware shown in FIG. 7 may vary depending on the implementation. Other internal hardware or peripheral devices, such as flash ROM (or equivalent nonvolatile memory) or optical disk drives and the like, may be used in addition to or in lieu of the hardware depicted in FIG. 7. Also, the processes of the present invention may be applied to a multiprocessor computer system. In general, Computer system 700 is controlled and coordinated by operating system (OS) software, which performs tasks such as process scheduling, memory management, networking and I/O services. Exemplary OS includes Linux™, Microsoft Windows™.

Although an exemplary embodiment of invention has been disclosed, it will be apparent to those skilled in the art that various changes and modifications may be made to achieve the advantage of the invention. It will be obvious to those skilled in the art that some components may be substituted with another component providing same function. The appended claims cover the present invention.

We claim:

1. A method for simulating structural responses of a compressible material in a finite element analysis, the method comprising:

defining a plurality of finite elements and a strain-stress curve to represent the compressible material;

calculating a plurality of stress function f($\lambda$) values, with each value at a particular stretch ratio $\lambda$ of interest, independent of trial-and-error curve fitting determination of material constants of Ogden strain energy function, wherein each of the plurality of stress function values equals to summation of a sequence of $\lambda^{1-\nu^j}\sigma_0(\lambda^{1-\nu^j})$, where j is an integer related to j-th term of the sequence, $\nu$ is Poisson's ratio of the compressible material, and $\sigma_0(\lambda^{1-\nu^j})$ is the stress value at $\lambda^{(-\nu)^j}$ defined by the strain-stress curve for the compressible material;

storing the plurality of stress function values into a lookup table; and evaluating element stresses, representing structural responses, in a local coordinate system from the lookup table in accordance with a set of principal stretches at each integration point of each of the finite elements in the finite element analysis of a structure including the compressible material.

2. The method as recited in claim 1, wherein the stress-strain curve is obtained from a physical experiment of the compressible material under a uni-axial loading condition.

3. The method as recited in claim 1, wherein the stretch ratio is a ratio between deformed length divided by original length of the compressible material in one direction.

4. The method as recited in claim 1, wherein the sequence has a total of m terms, and m is a positive integer, and the term of the sequence starts from 0 to m−1.

5. The method as recited in claim 1, wherein said calculating step is completed when absolute value of $|\lambda^{(-\upsilon)^j}-1|$ is less than a threshold.

6. The method as recited in claim 5, wherein the threshold is defined as 0.01.

7. The method as recited in claim 1, wherein the element stresses include nominal stress and true stress.

8. The method as recited in claim 1, wherein the set of principal stretches is obtained by solving eigensolution for deformation gradient tensor at each integration point of each of the finite element.

9. The method as recited in claim 1, said evaluating element stresses in local coordinate system further includes interpolating the lookup table to obtain the element stresses at the principal stretches.

10. The method as recited in claim 1, further comprises transforming the element stresses to global coordinate system.

11. A computer program product including a computer usable medium having computer readable code embodied in the medium for causing an application module to execute on a computer for simulating structural responses of a compressible material, the computer program product comprising:

program code for defining a plurality of finite elements and a strain-stress curve to represent the compressible material;

program code for calculating a plurality of stress function $f(\lambda)$ values with each value at a particular stretch ratio $\lambda$ of interest, independent of trial-and-error curve fitting determination of material constants of Ogden strain energy function, wherein each of the plurality of stress function values equals to summation of a sequence of $\lambda^{[\upsilon]^j}\sigma_0(\lambda^{[\upsilon]^j})$, where j is an integer related to j-th term of the sequence, $\upsilon$ is Poisson's ratio of the compressible material, and $\sigma_0(\lambda^{[\upsilon]^j})$ is the stress value at $\lambda^{(\upsilon)^j}$ defined by the strain-stress curve for the compressible material;

program code for storing the plurality of stress function values into a lookup table; and program code for evaluating element stresses, representing structural responses, in a local coordinate system from the lookup table in accordance with a set of principal stretches at each integration point of each of the finite elements in the finite element analysis of a structure including the compressible material.

12. The computer program product as recited in claim 11, wherein said calculating step is completed when absolute value of $|\lambda^{(-\upsilon)^j}-1|$ is less than a threshold.

13. The computer program product as recited in claim 12, wherein the threshold is defined as 0.01.

14. The computer program product as recited in claim 11, said program code for evaluating element stresses in local coordinate system further includes program code for interpolating the lookup table to obtain the element stresses at the principal stretches.

15. The computer program product as recited in claim 11, further comprises program code for transforming the element stresses to global coordinate system.

16. A system for simulating structural responses of a compressible material in a finite element analysis, the system comprising:

an I/O interface;

a communication interface;

a secondary memory;

a main memory for storing computer readable code for an application module;

at least one processor coupled to the main memory, the secondary memory, the I/O interface, and the communication interface, said at least one processor executing the computer readable code in the main memory to cause the application module to perform operations of:

defining a plurality of finite elements and a strain-stress curve to represent the compressible material;

calculating a plurality of stress function $f(\lambda)$ values with each value at a particular stretch ratio $\lambda$ of interest, independent of trial-and-error curve fitting determination of material constants of Ogden strain energy function, wherein each of the plurality of stress function values equals to summation of a sequence of $\lambda^{[-\upsilon]^j}\sigma_0(\lambda_{[-\upsilon]}^j)$, where j is an integer related to j-th term of the sequence, $\upsilon$ is Poisson's ratio of the compressible material, and $\sigma_0(\lambda_{[-\upsilon]}^j)$ is the stress value at $\lambda^{(-\upsilon)^j}$ defined by the strain-stress curve for the compressible material;

storing the plurality of stress function values into a lookup table; and evaluating element stresses, representing structural responses, in a local coordinate system from the lookup table in accordance with a set of principle stretches at each integration point of each of the finite elements in the finite element analysis of a structure including the compressible material.

17. The system as recited in claim 16, wherein said calculating step is completed when absolute value of $|\lambda^{(\upsilon)^j}-1|$ is less than a threshold.

18. The system as recited in claim 17, wherein the threshold is defined as 0.01.

19. The system as recited in claim 16, said evaluating element stresses in local coordinate system further includes operations of interpolating the lookup table to obtain the element stresses at the principal stretches.

20. The system as recited in claim 16, further comprises operations of transforming the element stresses to global coordinate system.

* * * * *